(12) United States Patent
Mullen

(10) Patent No.: US 8,035,029 B2
(45) Date of Patent: Oct. 11, 2011

(54) ENVIRONMENTALLY-ISOLATED ELECTRICAL JUNCTION BOX AND METHOD OF INSTALLING AND SERVICING THE SAME

(75) Inventor: Richard J. Mullen, Mount Kisco, NY (US)

(73) Assignee: G.A Fleet Associates, Inc., Harrison, NY (US)

( * ) Notice: Subject to any disclaimer, the term of this patent is extended or adjusted under 35 U.S.C. 154(b) by 217 days.

(21) Appl. No.: 12/470,085

(22) Filed: May 21, 2009

(65) Prior Publication Data

US 2010/0294527 A1 Nov. 25, 2010

(51) Int. Cl.
*H02G 3/08* (2006.01)
(52) U.S. Cl. ............... 174/50; 174/58; 174/64; 439/535; 248/906
(58) Field of Classification Search ............ 174/50, 174/57, 58, 64, 50.5; 439/535; 220/4.02; 248/906
See application file for complete search history.

(56) References Cited

U.S. PATENT DOCUMENTS 4,946,137 A * 8/1990 Adamczek ............ 254/134.3 FT
6,753,471 B2 * 6/2004 Johnson et al. ................. 174/50

\* cited by examiner

*Primary Examiner* — Dhirubhai R Patel
(74) *Attorney, Agent, or Firm* — Kirschstein, et al.

(57) ABSTRACT

A double containment electrical junction box is interfaced with electrical equipment in an equipment enclosure containing harmful contaminants, such as noxious gases and odors generated in a wet well containing a submersible electrical pump that pumps waste water from the well. A lower container contains electrical wiring connected to the pump, and is in gaseous communication with the well for enabling the contaminants from the well to enter the lower container. An openable upper container contains electrical junctions for the electrical wiring from the lower container. Cable and integrity seals between the containers prevents the contaminants in the lower container from reaching the upper container, to prevent migration of the contaminants away from the lower container.

18 Claims, 4 Drawing Sheets

ENVIRONMENTALLY-ISOLATED ELECTRICAL JUNCTION BOX AND METHOD OF INSTALLING AND SERVICING THE SAME

BACKGROUND OF THE INVENTION

This invention generally relates to an electrical junction box containing electrical wiring junctions that are isolated from a harmful electrical equipment enclosure, such as a wet well pumping system that produces contaminants and, more particularly, to a method of installing and servicing the box.

An electrical junction box is a wiring interface container that contains electrical wiring junctions or connections between wire runs from electrical equipment or outlets in an equipment enclosure, such as a home or like structure, and a main power supply provided by a local utility or a control panel. One purpose of the junction box is to conceal the electrical junctions from sight, which is more esthetically pleasing than a bunch of exposed electrical wires connected together. While it is true that the junction box presents a neater means of concealing the electrical junctions, the real value of the box is in providing a degree of protection for the wiring interface at the various junctions. The junction box can also help contain electrical sparks in the event that one of the junctions overloads for some reason, and thus limits the amount of damage that is caused by electrical sparking. The junction box may include a safety switch that allows the connections made within the box to be shut down in an emergency. An openable door on the box allows access by service personnel to the junctions.

Occasionally, system maintenance, replacements, upgrades and like service of the electrical equipment or the wiring within a particular equipment enclosure will dictate the installation of a larger or a new junction box to accommodate additional electrical junctions, or additional or larger electrical cables. In the event that the equipment enclosure contains harmful contaminants, as described below, such contaminants must be contained to prevent damage to other electrical devices and to prevent migration to occupied places.

One well-known example of a harmful equipment enclosure is a wet well pumping system for pumping waste water such as sewage, including liquid and solid waste, from community structures, such as domestic residences, office buildings, companies, industries, farms, institutions, and the like, to sewage or drainage pipes for treatment in a sewage treatment plant prior to safe, sanitary discharge. The sewage is typically collected in a wet well, which may be below or above ground. In a typical multi-story, office building application, the wet well is located below street level in the basement of the building and collects sewage from each floor, and the pumping system pumps the collected sewage back up to a street sewage pipe at a higher elevation. A typical pumping system includes one or more submersible electrical pumps in the wet well and connected to discharge pipes that extend generally upwardly from inside the well, through a cover overlying the well, and outside the well to the street sewage pipe. An electrical probe inside the well detects the level of waste water in the well to control the actuation of the pumps. Electrical wire runs are routed from the pumps and the probe inside the well to an electrical junction box located in the immediate vicinity outside the well. The junction box is, in turn, connected to a remote control panel that, in turn, is connected to a mains power supply.

Poisonous and noxious gases, odors and like contaminants can accumulate within the well and migrate to the junction box and, in turn, to the control panel, and beyond, to occupied places, such as offices, living spaces, mechanical rooms, etc., thereby exposing occupants and personnel to the noxious gases, odors, and contaminants accumulated therein. These contaminants can severely damage wiring and electrical devices, such as relays, electrical circuits, circuit breakers, terminal connections, connectors, etc.

SUMMARY OF THE INVENTION

One aspect of this invention is directed to an electrical junction box that is interfaced with electrical equipment, such as a pair of submersible electrical pumps that pump collected waste water, such as sewage, in an equipment enclosure, such as a wet well, containing harmful contaminants, such as poisonous and noxious gases, odors and like contaminants that accumulate within the well, as well as to a method of installing and servicing the junction box without exposing occupants, personnel and electrical devices to the contaminants, and without creating an environment in the junction box in which electrical sparking might be enhanced.

The junction box includes a first, preferably lower, container for containing electrical wiring connected to the electrical equipment. The lower container is in gaseous communication with the equipment enclosure for enabling the contaminants from the equipment enclosure to enter the lower container. The junction box also includes an openable, second, preferably upper, container for containing electrical junctions for the electrical wiring from the lower container. A seal is located between the containers for preventing the contaminants in the lower container from reaching the upper container. Thus, the contaminants are contained within the lower container, even when the upper container is opened for servicing. In effect, the junction box of this invention is a "double containment box" in which the contaminants from the equipment enclosure are trapped within the lower container or box, thereby enabling the service personnel to work in the upper container or box, and also preventing migration of the contaminants past the upper container to occupied places.

In a preferred embodiment, a raceway is provided between the lower container and the equipment enclosure for preventing the contaminants from the equipment enclosure from escaping into the ambient environment. The raceway is preferably configured as a pair of conduits through which the electrical wiring passes from the equipment enclosure to the lower container. A sleeve or spacer is provided between the containers for spacing the containers apart. The sleeve has an interior through which the electrical wiring passes from the lower container through the sleeve to the upper container. The seal is preferably configured as a plurality of cable seals that extend partially into the interior of the sleeve. Each cable seal is sealed about an individual wire of the electrical wiring passing through the sleeve to the upper container. An integrity seal is also employed when no wire is routed through the sleeve to the upper container.

The containers, as well as the conduits, the sleeve and the cable seals, are commonly mounted on a support, such as a pair of upright rails, as an assembled unit. In the event that the equipment enclosure is a wet well, as described above, the well is overlaid with a cover, and the assembled unit is mounted on the cover in an upright orientation in which the second container is positioned at a higher elevation than the first container. This orientation assists the upward migration of the gaseous contaminants upwardly to the first container for entrapment therein.

The method of installing and servicing the electrical junction box interfaced with the electrical equipment in the equipment enclosure containing harmful contaminants, is advantageously performed by routing electrical wiring connected to the electrical equipment to the lower container that is in gaseous communication with the equipment enclosure for enabling the contaminants from the equipment enclosure to enter the lower container, routing the electrical wiring from the lower container to an openable upper container that contains electrical junctions for the electrical wiring, preventing the contaminants in the lower container from reaching the upper container, and opening the upper container to enable service to be performed in the upper container.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
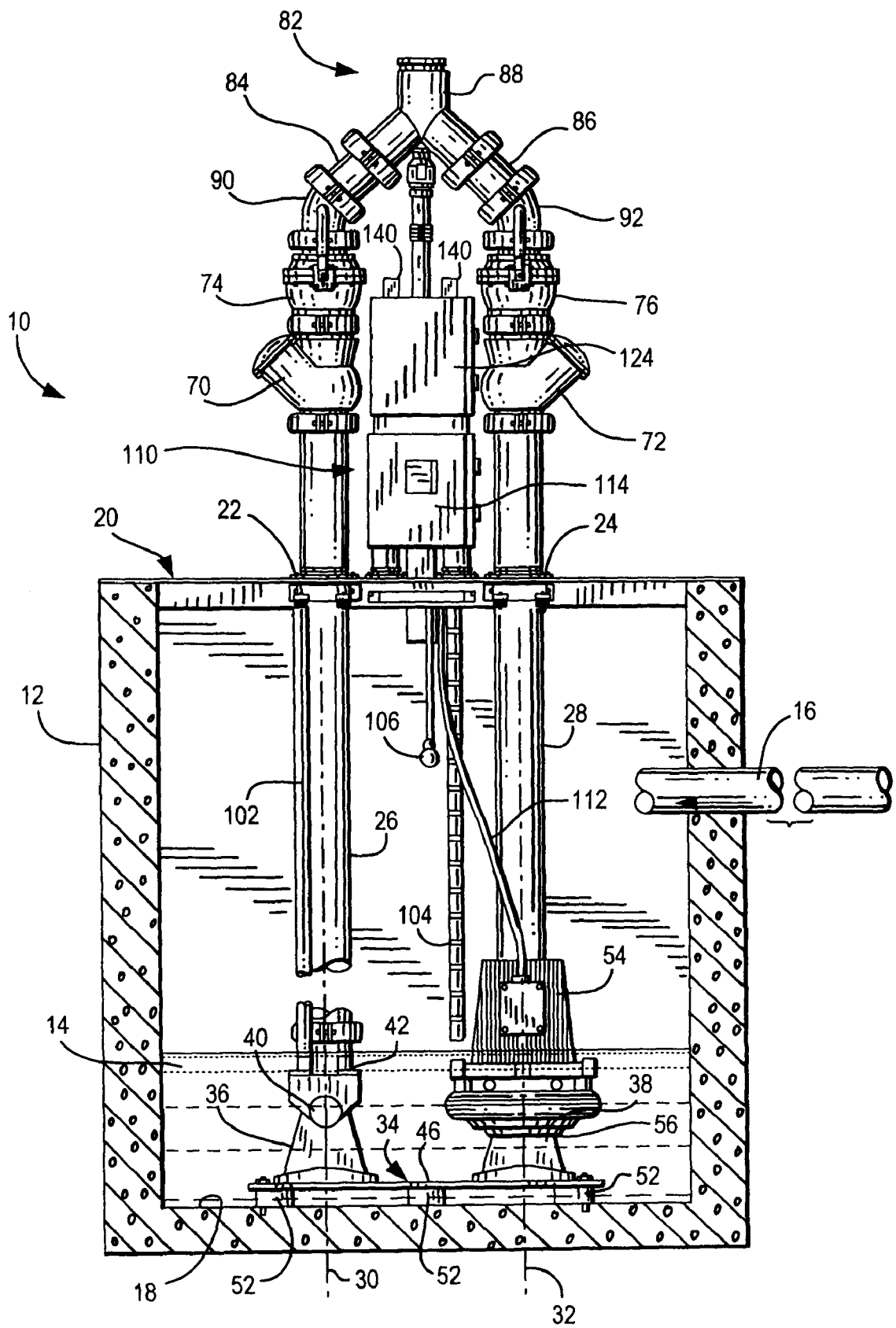
FIG. 1 is a part sectional, front elevational view showing a wet well pumping system installed with a double containment electrical junction box in accordance with this invention.

Referring now to the drawings, reference numeral 110 generally identifies a double containment electrical junction box, in accordance with this invention, interfaced with a pumping system 10 installed in a wet well 12 for pumping waste water 14, typically sewage with liquid and entrained solids, therefrom. The waste water 14 could also be storm water, ground water, condensate, or drain water. The well 12 is desirably constituted of concrete, masonry, steel or the like, and may either be above ground as a tank, or below ground as a pit. The waste water 14 is delivered from a community structure, as described above, to the well 12 via an inlet pipe 16. The pumping system 10 serves as a lift station to raise the waste water 14 from a lower elevation, for example, in a basement, to a higher elevation, for example, to a sewer line, typically for delivery to a sewage treatment plant.

A pair of bent elbows 36, 38 is mounted on an alignment platform 34 as an assembly for placement on a floor 18 of the well 12. The alignment platform 34 has an upright or vertical centerline, and the elbows 36, 38 are equidistantly mounted, preferably bolted, on the platform 34 at opposite sides of the centerline. Mounting holes are used to secure the elbows 36, 38 to a base 46 of the platform 34. Each bent elbow 36, 38 has a pump inlet 40 and a riser outlet 42, preferably angularly disposed 90 degrees apart. The alignment platform 34 serves as an alignment fixture to precisely locate and orient each pump inlet 40 so that it faces along a horizontal direction within the well 12, and to precisely locate and orient each riser outlet 42 so that it faces along the vertical direction within the well 12. The riser outlets 42 extend along the vertical direction along a pair of longitudinal axes generally parallel to the centerline of the platform 34.

A pair of upright risers 26, 28 is connected to the riser outlets 42. An alignment cover 20 is positioned to overlie the wet well 12. The alignment cover 20 has an upright or vertical centerline, and is formed with a pair of circular riser clearance holes 22, preferably having annular environmental seals therein. The riser clearance holes 22, 24 are equidistantly located on the cover 20 at opposite sides of the centerline. The radial distance from a center of each riser clearance hole 22, 24 to the centerline of the cover 20 is the same as the radial distance from the longitudinal axis of each riser outlet 42 to the centerline of the platform 34. The upright risers 26, 28 are passed through, and sealed at, the riser clearance holes 22, 24 along a pair of mutually parallel longitudinal axes 30, 32 extending along the vertical direction. The alignment cover 20 thus serves as another alignment fixture to precisely locate and orient the longitudinal axes 30, 32 of the risers 26, 28 in precise locations and orientations within the well 12 so that the longitudinal axes of the riser outlets 42 are aligned with the longitudinal axes 30, 32 of the risers 26, 28.

Next, the platform 34 is secured to the floor 18. The platform includes a plurality of legs 52 for supporting the base 46 at an adjustable height above the floor 18. These legs 52 are adjusted to compensate for an irregular, non-planar floor 18 and, in some retrofit applications, to overlie existing threaded studs already present in the floor 18. The elbows 36, 38 can thereupon be serviced and even replaced without removing the risers 26, 28, since the elbows 36, 38 can be slid transversely out from underneath the risers 26, 28 along the base 46 without mechanical interference from the studs, which are located below the base 46.

A pair of submersible electrical pumps 54 (only one shown so as not to encumber the drawings) is connected to each pump inlet 40 of the bent elbows 36, 38. A guide rail 102 is connected between the cover 20 and each pump 54 to help support the pump. Each pump 54 has a downwardly facing intake 56 and is operative for pumping waste water 14 from the well 12 though the respective elbow 36, 38 and the respective riser 26, 28 to outside the well 12. An electrical probe 104 detects the level of waste water in the well 12 to control the actuation of the pumps 54. A back-up float 104 serves as another detector of the level of waste water in the well. The pair of pumps provide a failsafe redundancy in case one of the pumps fails.

A pair of check valves 70, 72 is respectively connected to the risers 26, 28, preferably outside the well 18, to resist back flow of the sewage 14 toward the pumps 54. A pair of ball valves 74, 76 is respectively connected to the check valves 70, 72. A Y-shaped branch pipe 82 having a pair of inlet arms 84, 86 is respectively connected to the risers 26, 28 via elbows 90, 92 whose opposite ends are angularly spaced apart by 45 degrees. The Y-shaped branch pipe 82 has a common outlet arm 88 from which the sewage 14 pumped by both pumps 54 is discharged.

As described so far, the pumping system 10 concomitantly produces harmful contaminants, such as poisonous and noxious gases, odors and like contaminants from the waste water 14 in the wet well 12. These contaminants migrate from inside the wet well 12 to the electrical junction box 110 located outside the wet well 12, typically along the path along which the electrical wiring 112 is routed from the electrical pumps 54 through the cover 20 to the junction box 110. As described above, one aspect of this invention is to configure the junction box 110 to contain the contaminants to prevent their migration to occupied places and/or to electrical devices, and without creating an environment in the junction box 110 in which electrical sparking might be enhanced.

Figure 2:
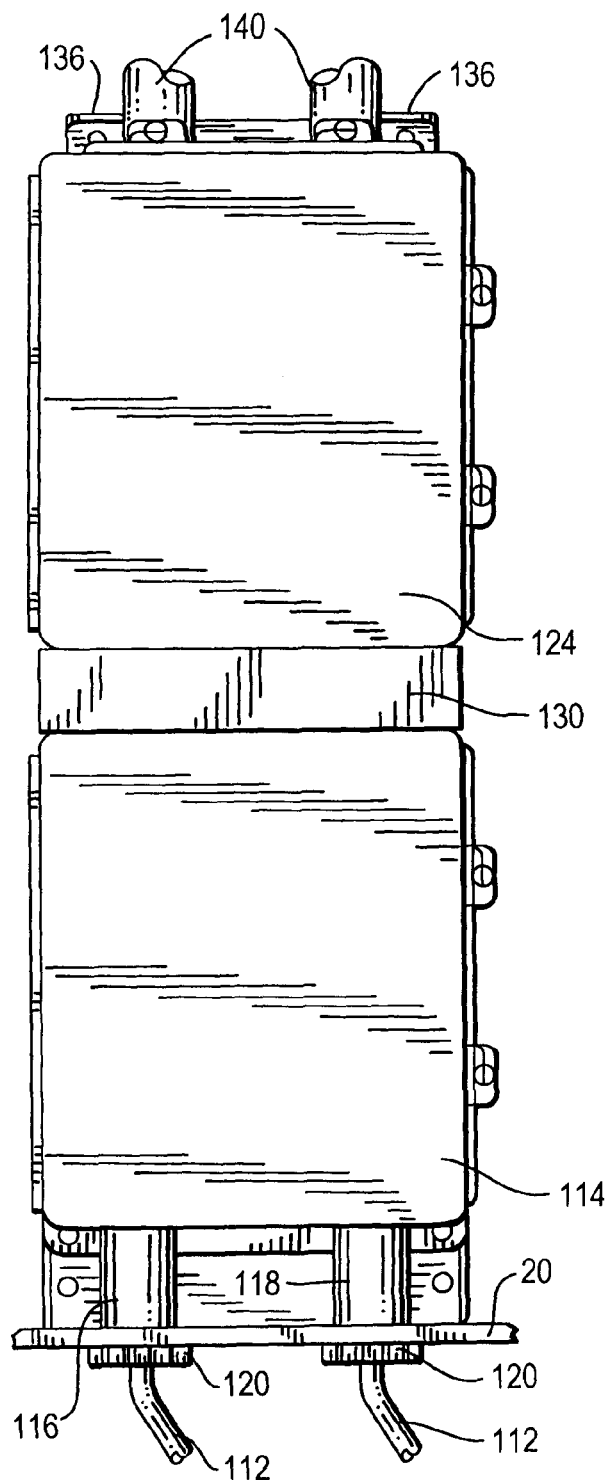
FIG. 2 is an enlarged, part sectional, front elevational view of the junction box of FIG. 1 in isolation.
Figure 3:
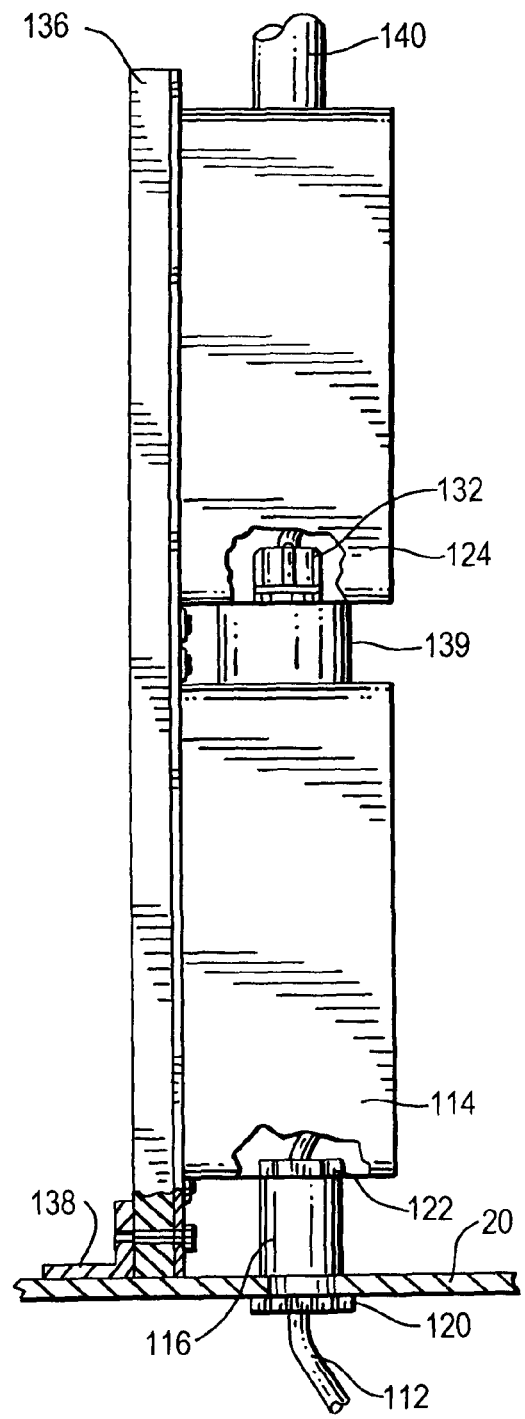
FIG. 3 is a partly broken-away, side elevational view of the junction box of FIG. 2.
Figure 4:
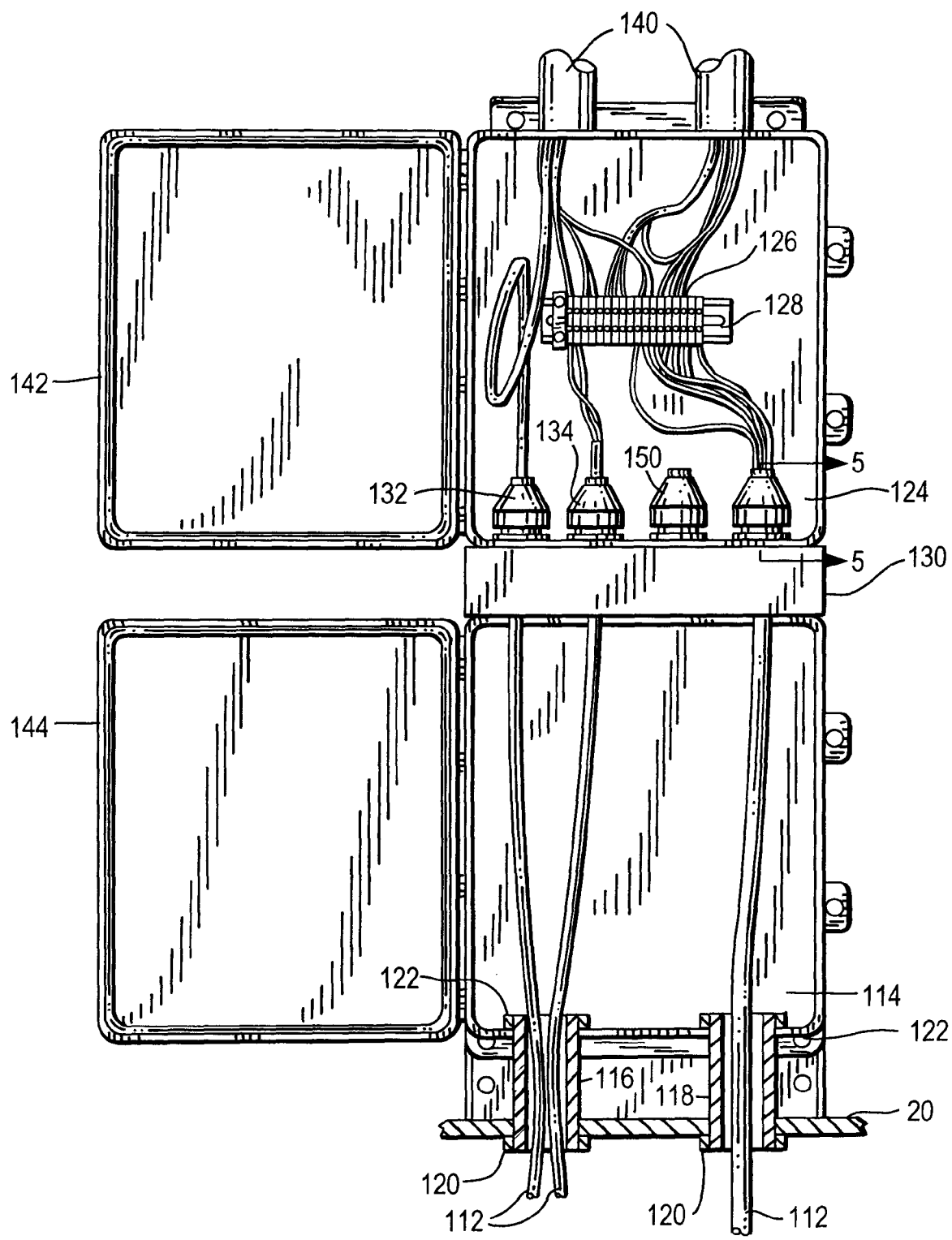
FIG. 4 is a view analogous to FIG. 2, but with the junction box opened.

The junction box 110, as best seen in FIGS. 2-4, includes a first, preferably lower, container 114 for containing a length of the electrical wiring 112 connected to the pumps 54. The lower container 114 is in gaseous communication with the wet well 12 for enabling the contaminants from the wet well 12 to enter the lower container 114. In a preferred embodiment, a wiring raceway, preferably configured as a pair of hollow, tubular, cylindrical conduits 116, 118, is provided between the lower container 114 and the wet well 12 for preventing the contaminants from the wet well 12 from escaping into the ambient environment. Chase bushings or environmentally-isolated annular couplers 120 threadedly connect the lower ends of the conduits 116, 118 to the cover 20. Additional chase bushings or environmentally-isolated annular couplers 122 threadedly connect the upper ends of the conduits 116, 118 to the lower container 114. The electrical wiring 112 from each pump 54, as well as additional electrical wiring from other electrical devices in the well 12, e.g., the probe 104, passes from the wet well 12 through the conduits 116, 118 with clearance to the lower container 114, and the contaminants pass through the conduits 116, 118 en route to the lower container 114.

The junction box 110 also includes an openable, second, preferably upper, container 124 for containing electrical junctions 126 (see FIG. 4) for the electrical wiring 112 routed from the lower container 114. The junctions 126 are preferably arranged in rows (only one illustrated) and mounted on a terminal strip 128 inside the upper container 124. A spacer or tubular sleeve 130 is provided between the containers 114, 124 for spacing the containers apart. The sleeve 130 has a hollow interior through which the electrical wiring 112, as well as other wiring, passes from the lower container 114 through the sleeve 130 to the terminal strip 128 inside the upper container 124.

Figure 5:
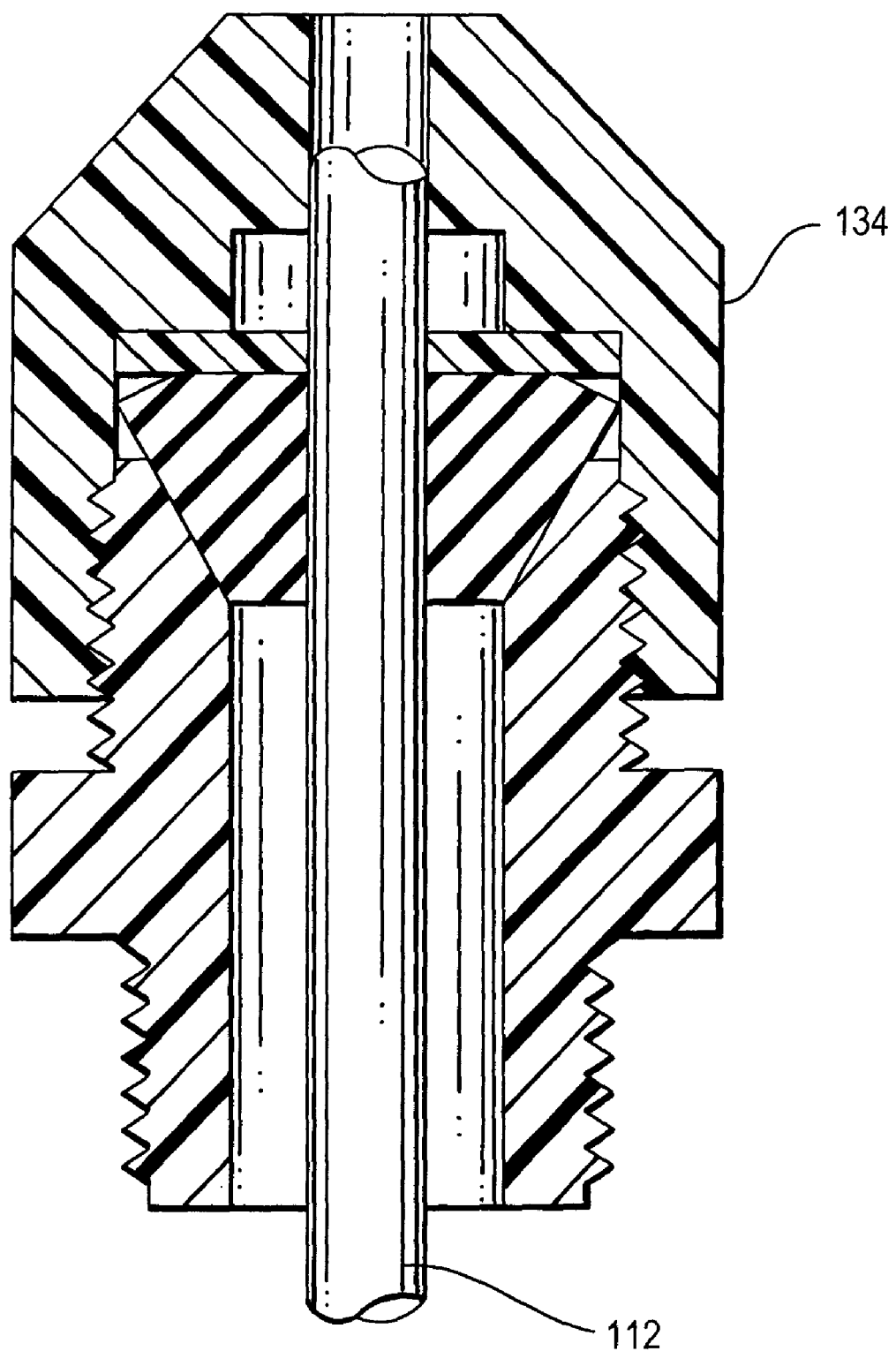
FIG. 5 is a sectional view taken on the line 5-5 of FIG. 4 depicting an individual cable seal.

A seal, preferably configured as a plurality of cable seals 132, 134, and/or one or more integrity seals 150, is located between the containers 114, 124 for preventing the contaminants in the lower container 114 from reaching the upper container 114. The cable seals 132, 134 extend partially into the interior of the sleeve 130. As best seen in FIG. 5, each cable seal 132, 134 is sealed about an individual wire of the electrical wiring 112 passing through the sleeve 130 to the upper container 124. Cable seals 132 are larger than cable seals 134 to accommodate wires of larger diameters. For example, larger diameter cable seals 132 can be used for the electrical wiring 112 to the pumps 54, while smaller diameter cable seals 134 can be used for other electrical wiring, such as wiring for the electrical probe 104. Integrity seal 150 is similar to one of the cable seals, except it has no wire passing therethrough; it is a sealed plug. If a wire is removed, then the opening can be plugged with their integrity seal 150.

Each wire is connected to a respective junction 126 at the terminal strip 128 inside the upper container 124. Another wire is connected to the respective junction 126 at the terminal strip 128 and is routed out of the upper container 124 via a pair of chase bushings or environmentally-isolated annular couplers 140 to a remote control panel (not illustrated).

The containers 112, 124, as well as the conduits 116, 118, the sleeve 130 and the cable seals 132, 134, are commonly mounted on a support, such as a pair of upright rails 136, as an assembled unit. As best seen in FIG. 3, each rail 136 is mounted on the cover 20 with a bracket 138, and the assembled unit is mounted on the cover 20 in an upright orientation in which the upper container 124 is positioned at a higher elevation than the lower container 114. This orientation assists the upward migration of the gaseous contaminants upwardly to the lower container 114 for entrapment therein.

Thus, wiring service can be performed at the junctions 126 in the upper container 124 without exposing the service personnel to the contaminants when the upper container 124 is opened by opening a door 142. The lower container 114 also has a door 144 that is shown opened in FIG. 4 only to reveal its interior; the door 144 is normally locked closed. The junction box of this invention is a "double containment box" in which the contaminants from the wet well or analogous equipment enclosure are trapped within the lower container 114 or box, thereby preventing the contaminants from migrating to occupied places or electrical devices.

It will be understood that each of the elements described above, or two or more together, also may find a useful application in other types of constructions differing from the types described above. For example, the invention is not intended to be limited to the use of wet well pumping systems, or only to wiring from two pumps, or only to wiring from pumps and probes. More than one double containment box can be interfaced at a particular equipment enclosure.

While the invention has been illustrated and described as embodied in an environmentally-isolated, electrical junction box and method of installing and servicing the same, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. An electrical junction box that interfaces with electrical equipment in an equipment enclosure that contains harmful contaminants, comprising:

a first container having walls bounding an interior that contains electrical wiring connected to the electrical equipment, the interior of the first container being in gaseous communication with the equipment enclosure to enable the contaminants from the equipment enclosure to enter the first container;

an openable second container having walls bounding an interior that contains electrical junctions to be serviced;

a sleeve between the containers that spaces the containers apart, the sleeve having walls bounding an interior through which the electrical wiring passes from the first container through the sleeve to the second container for connection to the electrical junctions;

a seal that prevents the contaminants in the interior of the first container from reaching the interior of the second container to prevent migration of the contaminants into the second container, the seal including a cable seal sealed about the electrical wiring passing through the sleeve to the second container; and at least one of the walls of the second container being movable to open the second container to gain access to the electrical junctions to be serviced without exposure to the contaminants.

2. The junction box of claim 1, and a raceway between the first container and the equipment enclosure that prevents the contaminants from the equipment enclosure from escaping into the ambient environment.

3. The junction box of claim 2, wherein the raceway is a pair of conduits through which the electrical wiring passes from the equipment enclosure to the first container.

4. The junction box of claim 1, wherein the cable seal extends partially into the interior of the sleeve and partially into the interior of the second container.

5. The junction box of claim 1, wherein the cable seal frictionally engages and sealingly surrounds an individual wire of the electrical wiring passing through the sleeve to the second container.

6. The junction box of claim 5, wherein the seal includes an integrity seal that blocks the interior of the sleeve from the interior of the second container.

7. The junction box of claim 1, and a support on which the containers are commonly mounted as an assembled unit.

8. The junction box of claim 7, wherein the equipment enclosure is a wet well having a cover that overlies the well, and wherein the assembled unit is mounted on the cover in an upright orientation in which the second container is above the first container.

9. The junction box of claim 1, wherein the equipment enclosure is a wet well having a submersible electrical pump inside the well that pumps waste water from the well to outside the well, and wherein the electrical wiring is connected to, and routed from, the electrical pump.

10. An electrical junction box that interfaces with a submersible electrical pump inside a wet well that pumps waste water from the well to outside the well with concomitant generation of harmful gaseous contaminants in the well, comprising:
   a lower container having walls bounding an interior that contains electrical wiring connected to, and routed from, the electrical pump, the interior of the lower container being in gaseous communication with the well to enable the contaminants from the well to enter the lower container;
   an openable upper container having walls bounding an interior that contains electrical junctions to be serviced;
   a hollow sleeve between the containers that spaces the containers apart, the sleeve having walls bounding an interior through which the electrical wiring passes from the lower container through the sleeve to the upper container for connection to the electrical junctions;
   a plurality of seals that prevent the contaminants in the interior of the lower container from reaching the interior of the upper container to prevent migration of the contaminants into the upper container, at least one of the seals being sealed about an individual wire of the electrical wiring passing through the sleeve to the upper container;
   at least one of the walls of the upper container being movable to open the upper container to gain access to the electrical junctions to be serviced without exposure to the contaminants; and
   a support on which the containers are commonly mounted as an assembled unit outside the well.

11. A method of installing and servicing an electrical junction box interfaced with electrical equipment in an equipment enclosure that contains harmful contaminants, comprising the steps of:
   routing electrical wiring connected to the electrical equipment to an interior bounded by walls of a first container, the interior of the first container being in gaseous communication with the equipment enclosure to enable the contaminants from the equipment enclosure to enter the first container;
   mounting electrical junctions to be serviced in an interior bounded by walls of a second container;
   spacing the containers apart by mounting a sleeve between the containers, the sleeve having walls bounding an interior;
   routing the electrical wiring from the first container through the sleeve to the second container, and connecting the routed electrical wiring to the electrical junctions;
   preventing the contaminants in the interior of the first container from reaching the interior of the second container to prevent migration of the contaminants into the second container, by sealing about the routed electrical wiring passing through the sleeve to the second container; and
   opening the second container by moving one of the walls of the second container to gain access to the electrical junctions to be serviced without exposure to the contaminants.

12. The method of claim 11, and preventing the contaminants from the equipment enclosure from escaping into the ambient environment by connecting a raceway between the first container and the equipment enclosure.

13. The method of claim 12, and configuring the raceway as a pair of conduits through which the electrical wiring is routed from the equipment enclosure to the first container.

14. The method of claim 11, wherein the preventing step is performed by extending a cable seal partially into the interior of the sleeve and partially into the interior of the second container.

15. The method of claim 11, wherein the preventing step is performed by sealing each individual wire of the electrical wiring routed through the sleeve to the second container.

16. The method of claim 11, and commonly mounting the containers as an assembled unit on a support.

17. The method of claim 16, wherein the equipment enclosure is a wet well having a cover that overlies the well, and mounting the assembled unit on the cover in an upright orientation in which the second container is above the first container.

18. The method of claim 11, wherein the equipment enclosure is a wet well having a submersible electrical pump inside the well that pumps waste water from the well to outside the well, and connecting the electrical wiring to the electrical pump.

* * * * *